(12) United States Patent
Han et al.

(10) Patent No.: US 11,984,452 B2
(45) Date of Patent: May 14, 2024

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Linqian Han, Beijing (CN); Guoqiang Tang, Beijing (CN); Chaojin Yang, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 150 days.

(21) Appl. No.: 17/425,734

(22) PCT Filed: Jan. 20, 2021

(86) PCT No.: PCT/CN2021/072805
§ 371 (c)(1),
(2) Date: Jul. 26, 2021

(87) PCT Pub. No.: WO2021/147883
PCT Pub. Date: Jul. 29, 2021

(65) Prior Publication Data
US 2022/0320144 A1    Oct. 6, 2022

(30) Foreign Application Priority Data

Jan. 22, 2020 (CN) .......................... 202010075977.5

(51) Int. Cl.
*H01L 27/12* (2006.01)

(52) U.S. Cl.
CPC ................................. *H01L 27/124* (2013.01)

(58) Field of Classification Search
CPC ... H01L 27/124; H01L 27/32; H01L 27/3241; H01L 27/3244; H01L 27/3276;
(Continued)

(56) References Cited

U.S. PATENT DOCUMENTS 10,756,136 B1    8/2020  Ma et al.
11,100,858 B2 *  8/2021  An et al. ............. H01L 27/3276
(Continued)

FOREIGN PATENT DOCUMENTS

CN    207338380 U    5/2018
CN    108594552 A    9/2018
(Continued)

OTHER PUBLICATIONS

International Search Report for PCT/CN2021/072805 dated Apr. 15, 2021.

*Primary Examiner* — Jonathan Han
(74) *Attorney, Agent, or Firm* — Ling Wu; Stephen Yang; Ling and Yang Intellectual Property

(57) ABSTRACT

A display panel and a display device are provided. The display panel includes a first display area and a second display area, as well as M first wiring groups and N second wiring groups arranged along a first direction, wherein M and N are positive integers; in the first display area, the first wiring groups and the second wiring groups are arranged alternately according to a first order; in the second display area, at least part of the first wiring groups and part of the second wiring groups are arranged alternately according to a second order, the second order is different from the first order, and the alternate arrangement in the second order enables a blank area between the adjacent first wiring groups to be increased.

17 Claims, 5 Drawing Sheets

(58) Field of Classification Search
CPC ............. H01L 27/3279; H01L 27/1218; G02F 1/1345; G02F 1/13452; G02F 1/13454; G02F 1/13456; G02F 1/13458
See application file for complete search history.

(56) References Cited

U.S. PATENT DOCUMENTS

| | | |
|---|---|---|
| 2019/0346953 A1 | 11/2019 | Peng et al. |
| 2021/0013298 A1 | 1/2021 | Her et al. |
| 2021/0201810 A1* | 7/2021 | Feng et al. ........... G09G 3/3226 |

FOREIGN PATENT DOCUMENTS

| | | |
|---|---|---|
| CN | 110061014 A | 7/2019 |
| CN | 110444125 A | 11/2019 |
| CN | 111261641 A | 6/2020 |
| KR | 10-2019-0081675 A | 7/2019 |
| WO | 2019199139 A1 | 10/2019 |

* cited by examiner

DISPLAY PANEL AND DISPLAY DEVICE

CROSS-REFERENCE TO RELATED-APPLICATION

The present application claims priority of Chinese patent application No. 202010075977.5, filed to CNIPA on Jan. 22, 2020 and entitled "Display Panel and Display Device", the contents of which should be interpreted as being incorporated herein by reference.

TECHNICAL FIELD

Embodiments of the present disclosure relate, but are not limited, to the technical field of display, and particularly to a display panel and a display device.

BACKGROUND

With the development of technology, market's demand for display panels with high screen-to-body ratio becomes more and more urgent, and the display panel is developing towards a direction of full-screen and lightness. The implementation of the full-screen has to rely on the under-screen camera technology, that is, when an imaging function is not required, a camera illuminates normally like other areas of the display panel. When the imaging function is required, a camera area has a normal imaging function. However, the camera area requires higher optical transmittance due to its imaging function, so the transmittance of a normal luminous zone is very insufficient to meet the demand of the camera. An "H+L" design is adopted, that is, the design that high PPI is used in a normal area and low PPI is used in an area with higher transmittance. For the area with low PPI, the transmittance of positions for arranging pixel units is lower, and the transmittance of blank areas between the pixels is higher, such that the overall transmittance of the area with low PPI is improved.

SUMMARY

A summary of the subject matter is described in the present disclosure below in detail. The summary is not intended to limit the scope of protection of the claims.

In to a first aspect, an embodiment of the present disclosure provides a display panel, including a first display area and a second display area, as well as M first wiring groups and N second wiring groups arranged along a first direction, wherein M and N are positive integers;

in the first display area, the first wiring groups and the second wiring groups are arranged alternately according to a first order; and in the second display area, at least part of the first wiring groups and part of the second wiring groups are arranged alternately according to a second order, the second order is different from the first order, and the alternate arrangement in the second order enables a blank area between adjacent first wiring groups to be increased.

In to a second aspect, an embodiment of the present disclosure provides a display device, including the display panel described in the first aspect and a sensor unit, wherein the sensor unit is arranged in the second display area of the display panel and located at one side of a substrate base plate away from a light exit direction, and a light-sensitive surface of the sensor unit is towards the display panel.

After the drawings and the detailed descriptions are read and understood, the other aspects may be comprehended.

BRIEF DESCRIPTION OF DRAWINGS

By reading the detailed descriptions made to non-restrictive embodiments with reference to the following drawings, other features, objectives, and advantages of the present disclosure will be clearer.

DETAILED DESCRIPTION

Figure 1:
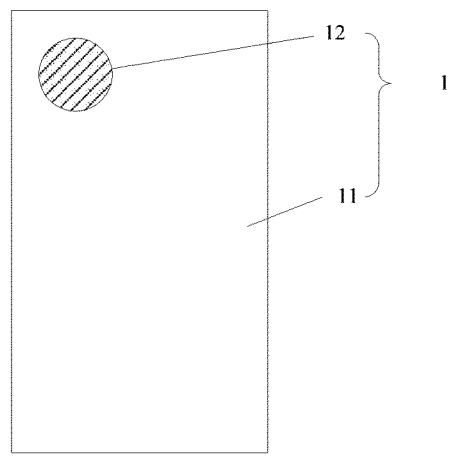
FIG. 1 is a structural schematic diagram of a display panel according to an embodiment of the present disclosure.

The present disclosure will be further described below in combination with the drawings and the embodiments in detail. It can be understood that the embodiments described here are not used to limit the present disclosure but only to explain the present disclosure. In addition, it should be noted that for ease of description, only parts related to the present disclosure are shown in the drawings.

It should be noted that the embodiments in the present disclosure and the features in the embodiments may be combined mutually if there is no conflict. The present disclosure will be described in combination with the drawings and the embodiments in detail.

Referring to FIG. 1, FIG. 1 is a structural schematic diagram of a display panel according to an embodiment of the present disclosure.

The display panel 1 includes a first display area 11 and a second display area 12. Each display area includes multiple pixel unit areas (not shown in the figure). Herein, the density of the pixel unit areas in the first display area 11 is greater than that of the pixel unit areas in the second display area 12. That is, in the first display area and the second display area that have the same area, the number of pixel drive circuits in the second display area is less than that of the pixel drive circuits in the first display area.

Herein, as shown in FIG. 1, the shape of the second display area 12 may be round or in other shapes. In this embodiment, the second display area 12 provided to the round.

Figure 2:
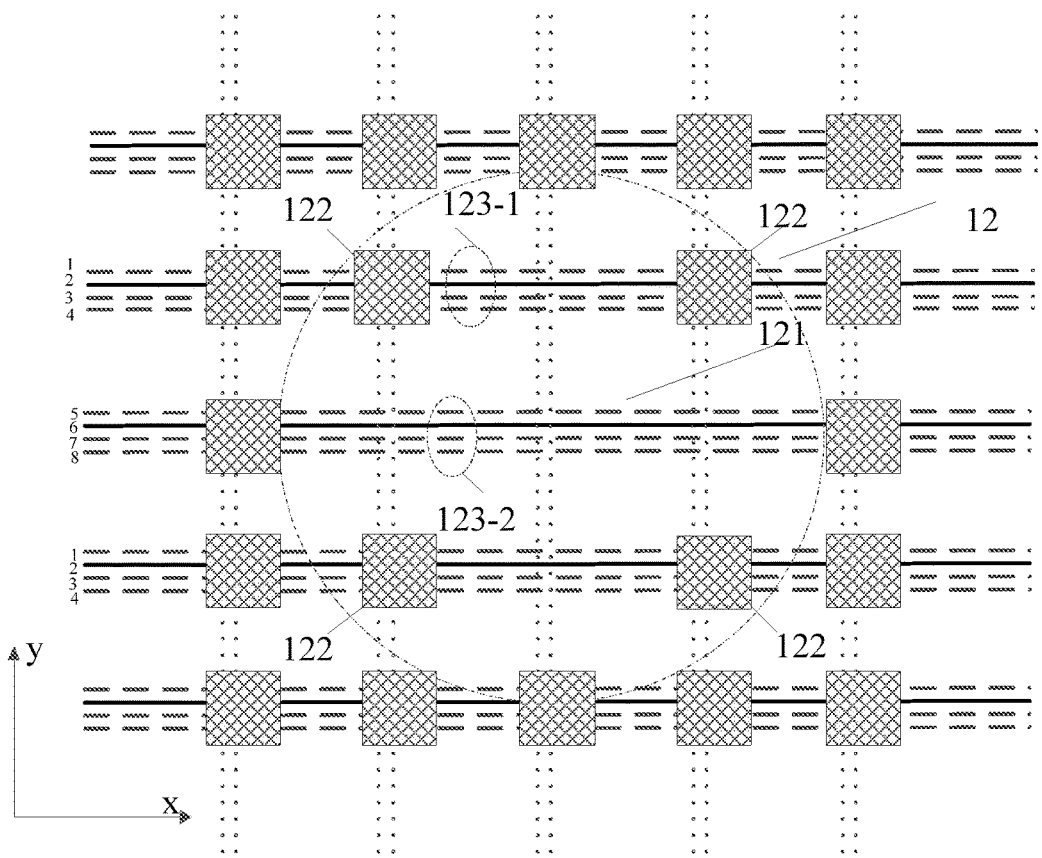
FIG. 2 is a schematic top view of a local structure of a second display area according to an embodiment of the present disclosure.

Herein, for the second display area 12, please refers to FIG. 2. FIG. 2 is a schematic top view of a local structure of a second display area according to an embodiment of the present disclosure.

As shown in FIG. 2, the second display area 12 includes multiple light transmitting areas 121 and multiple pixel unit areas 122. There are four pixel unit areas 122 around each light transmitting area 121. Light is transmitted to a sensor (such as a camera) of a display panel through the light transmitting areas 121, the sensor receives the light, and thereby a camera function is implemented. Moreover, the pixel unit areas 122 are arranged around the light transmitting areas 121, and the pixel unit areas 122 enables the second display area to implement a display function. The screen-to-body ratio of a display screen is effectively improved by reusing an imaging function and a display function in the second display area.

In order to implement the reuse of the imaging function and the display function in the second display area, corresponding signal wirings need to be arranged among the pixel unit areas. For example, multiple wiring groups in a row direction are arranged in a first direction x. When each wiring group is in conduction connection with the pixel unit areas arranged in the first direction, the wiring group is configured to drive a luminous device arranged in a pixel unit area to work, so as to form a row of a pixel array. The multiple wiring groups in the first direction is distinguished according to whether the wiring groups establish a connection with the pixel unit areas in the second display area, a wiring group establishing a connection with the pixel unit areas in the second display area is a first wiring group 123-1, and a wiring group not establishing a connection with the pixel unit areas in the second display area is a second wiring group 123-2.

As shown in FIG. 2, the first wiring group 123-1 and the second wiring group 123-2 are alternately arranged in the first display area and the second display area according to a first order. As shown in FIG. 2, the first order is from top to bottom, the first wiring group 123-1 with a same serial number is arranged at an upper area of the second wiring group 123-2 with a same serial number, and a certain spacing distance is kept between the two wiring groups. For example, the relation between the first wiring group 123-1 with the serial number 1 and the second wiring group 123-2 with the serial number 1 is that the first wiring group 123-1 with the serial number 1 is arranged at an upper position of the second wiring group 123-2 with the serial number 1.

In the embodiments of the present disclosure, A being arranged at the upper position (area) of B means that A is arranged at a position (area), away from a substrate base plate direction, of B.

The first wiring group 123-1 is configured to be connected to adjacent pixel unit areas in the first direction in both the first display area and the second display area. The drawings of the present disclosure take the first wiring group 123-1 including four wirings as an example: wiring 1, wiring 2, wiring 3 and wiring 4. The number of wirings included in the wiring group is determined according to circumstances of circuit, and no limits are made thereto in the embodiments of the present disclosure.

The second wiring group 123-2 is connected to adjacent pixel unit areas in the first direction in the first display area. Although no pixel unit area is arranged in the second display area, the second wiring group still continues to extend along the first direction. After passing through the second display area, the second wiring group is connected to the pixel unit areas in the first direction again in the first display area. The second wiring group 123-2 is not configured to be connected to the pixel unit areas in the second display area. The drawings of the present disclosure take the second wiring group 123-2 including four wirings as an example: wiring 5, wiring 6, wiring 7 and wiring 8. The number of wirings included in the wiring group is determined according to circumstances of circuit, and no limits are made thereto in the embodiments of the present disclosure.

Herein, the signal wires included in the first wiring group 123-1 and the second wiring group 123-2 may be the same, for example, the first wiring group 123-1 and the second wiring group 123-2 both include reset control signal wires, reset signal wires, gate drive control wires, light-emitting control signal wires, etc. The signal wires included in the first wiring group 123-1 and the second wiring group 123-2 may be partially the same, which is determined according to circuit circumstances. No limits are made thereto in the embodiments of the present disclosure.

Similarly, multiple wiring groups in a column direction are arranged in a second direction y. The wiring groups are configured to be connected to adjacent pixel unit areas in the second direction in both the first display area and the second display. The wiring groups are connected to the adjacent pixel unit areas in the second direction in the first display area. In the second display area, since no pixel unit area is arranged, the wiring groups still continues to extend along the second direction. After passing through the second display area, the wiring groups are connected to the adjacent pixel unit areas in the second direction in the first display area. The wiring groups in the second direction may include data signal wires, power voltage signal wires, etc. The wiring groups are usually arranged on a source drain electrode layer.

Figure 3:
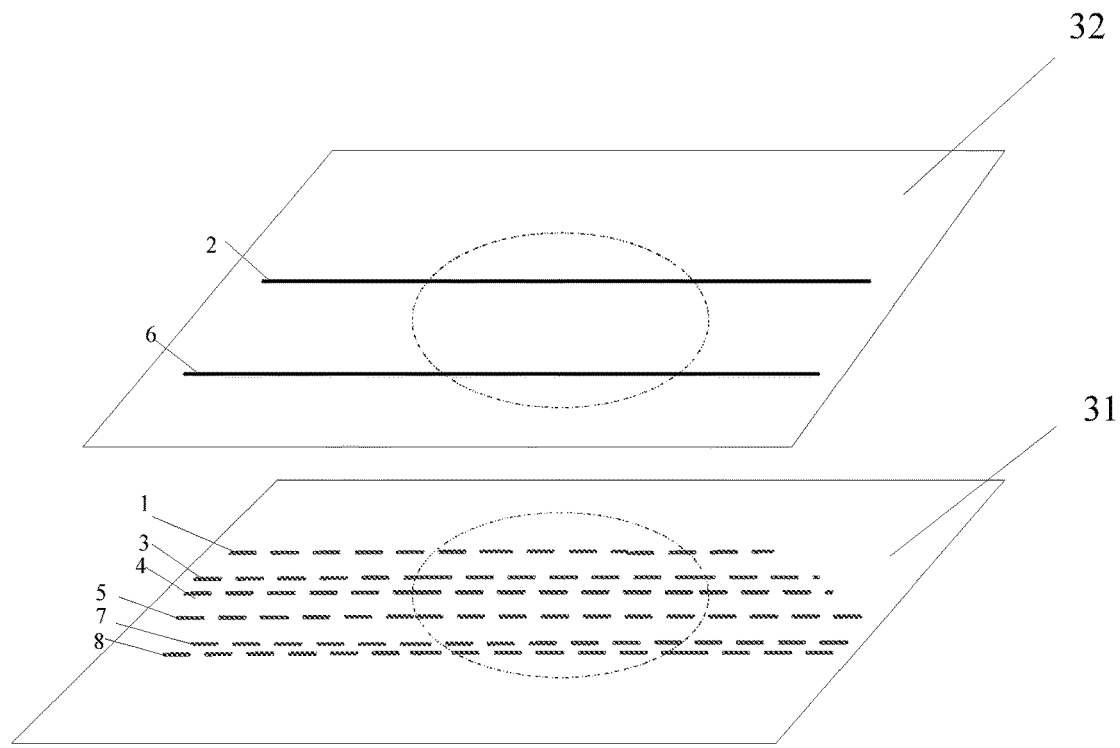
FIG. 3 is a schematic diagram of a wiring scheme of a first wiring group and a second wiring group.

Wiring conditions of the first wiring group and the second wiring group will be understood with reference to FIG. 3. FIG. 3 is a schematic top view of a wiring scheme of the first wiring group and the second wiring group, and FIG. 3 shows a positional relation between the first wiring group and the second wiring group that have a same serial number.

As shown in FIG. 3, the wiring 1, the wiring 3 and the wiring 4 included in the first wiring group 123-1 are arranged on a first gate metal layer 31 (i.e., gate1 metal layer), and the wiring 2 included in the first wiring group 123-1 is arranged on a second gate metal layer 32 (i.e., gate2 metal layer).

The wiring 5, the wiring 7 and the wiring 8 included in the second wiring group 123-2 are arranged on the first gate metal layer 31 (i.e., the gate1 metal layer), and the wiring 6 included in the second wiring group 123-2 is arranged on the second gate metal layer 32 (i.e., the gate2 metal layer).

It can be known from the wiring condition in FIG. 3 that a density of wirings of the first wiring group 123-1 and the second wiring group 123-2 in the second display area enables that a probability of light entering the second display area being transmitted to the first gate metal layer is reduced, this will lead to poor imaging quality when the second display area is reused for a camera function.

Figure 4:
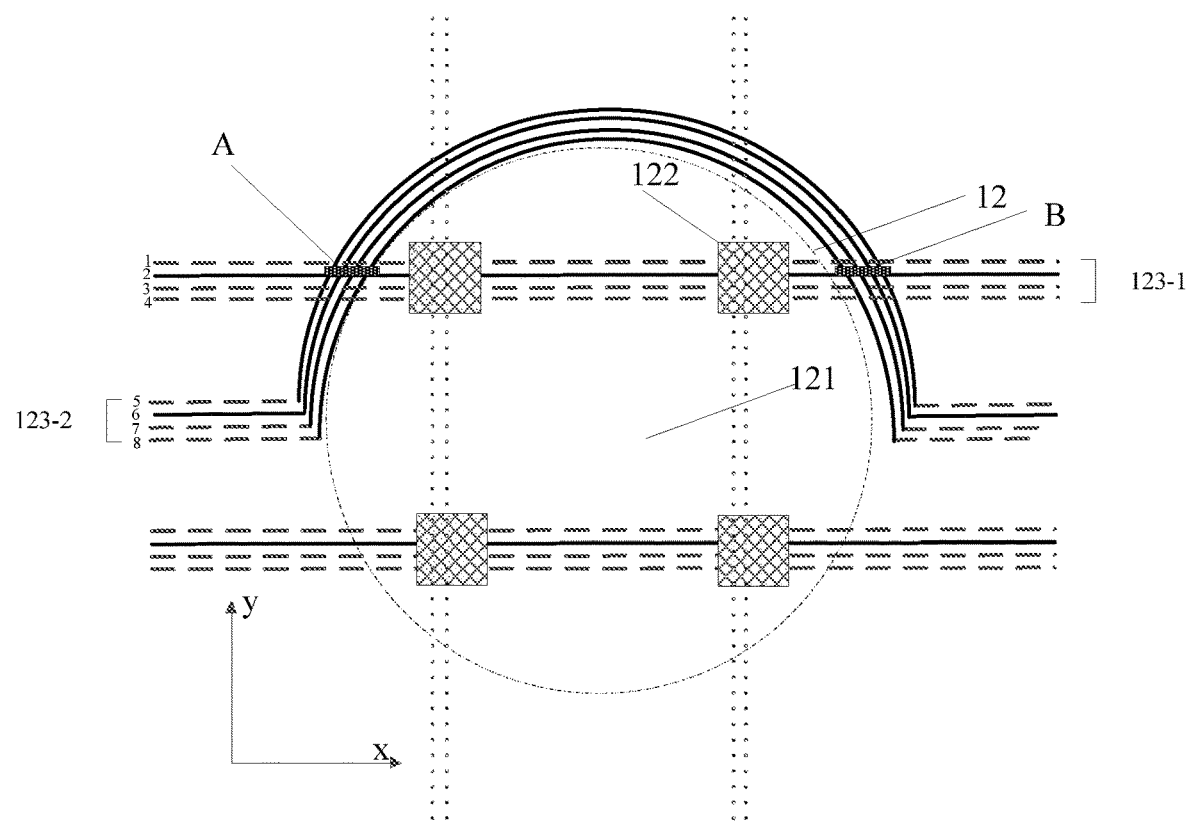
FIG. 4 is a schematic top view of a wiring scheme of a second wiring group according to an embodiment of the present disclosure.

An embodiment of the present disclosure provides a scheme of removing the multiple wiring groups arranged in the second display area and arrange them outside the second display area, so as to increase a light transmissive area of the light transmitting area to improve the imaging quality of the second display area. Referring to FIG. 4, FIG. 4 is a schematic top view of a wiring scheme of the second wiring group according to an embodiment of the present disclosure, and FIG. 4 shows a wiring relation between the first wiring group and the second wiring group that have a same serial number.

As shown in FIG. 4, in the second display area, no second wiring group is arranged between the adjacent first wiring groups.

In FIG. 4, no second wiring group is arranged between the two adjacent first wiring groups. The second wiring group 123-2 is arranged in an outer edge area of the second display area, so as to reduce the area occupied by the second wiring group in the second display area, such that the light transmission of the light transmitting area 121 is improved, the light transmittance of the light transmitting area is increase and the imaging quality when the second display area is reused for an imaging function is improved.

The manner of arranging the second wiring group 123-2 in the outer edge area of the second display area may be along an upper edge area of the schematic top view of the second display area, or a lower edge area of the schematic top view. For example, the second display area is round, which may be divided into an outer area of an upper semicircle and an outer area of a lower semicircle. The manner of arranging the second wiring group at the outer edge of the second display area may be adjusting the second wiring group in the upper semicircle to an upper edge of the upper semicircle, and adjust the second wiring group in the lower semicircle to a lower edge of the lower semicircle.

As shown in FIG. 4, the first wiring group 123-1 includes four first wirings, which are numbered from top to bottom, including wiring 1, wiring 2, wiring 3 and wiring 4. The second wiring group 123-2 includes four second wirings, which are numbered from top to bottom, including wiring 5, wiring 6, wiring 7 and wiring 8.

Herein, all wirings of the second wiring group 123-2 may pass through a wiring arrangement area of the first wiring group 123-1 via a first opening A on the wiring 2, pass through a wiring arrangement area of the first wiring group 123-1 via a second opening B on the wiring 2, and continue to extend along the wiring direction of the second wiring group 123-2 in the first display area.

In the embodiments of the present disclosure, in order to reduce the area occupied by the second wiring group 123-2 in the second display area, the second display area 12 is bypassed by converting the wiring 5, the wiring 7 and the wiring 8 in the second wiring group to the second gate metal layer and arranging the wiring 6 in the second gate metal layer. In this way, the area occupied by the second wiring group in the second display area may be reduced, so the light transmittance of the second display area is improved.

Figure 5:
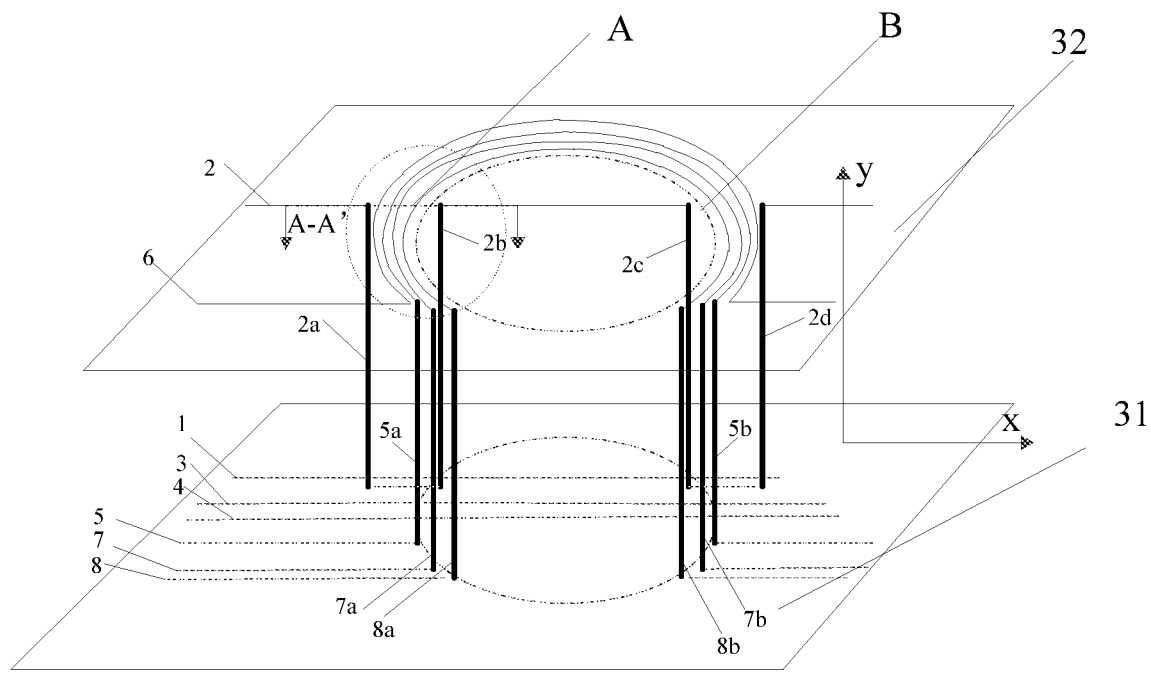
FIG. 5 is a structural schematic diagram of a second wiring group after adjustment according to an embodiment of the present disclosure.

The schematic diagram of the second wiring group bypassing the second display area is described below with reference to FIG. 5. FIG. 5 is a structural schematic diagram of a second wiring group after adjustment according to an embodiment of the present disclosure.

As shown in FIG. 5, on the second gate metal layer 32, a first opening A and a second opening B are formed on the wiring 2 in the first wiring group through a processing step. The wiring 2 is divided into three portions by the first opening A and the second opening B. In FIG. 5, from a left side and along the first direction X, the positional relation between the three portions and the first opening A and the second opening B is successively: the first portion, the first opening A, the second portion, the second opening B and the third portion.

A perforated conductive wire 2a is formed by a processing step. One end of the perforated conductive wire 2a is connected to one end of the first portion of the wiring 2, and the other end of the perforated conductive wire 2a is connected to a new wiring arranged on the first gate metal layer 31.

Similarly, a perforated conductive wire 2b is formed by a processing step. One end of the perforated conductive wire 2b is connected to one end of the second portion of the wiring 2, and the other end of the perforated conductive wire 2b is connected to a new wiring arranged on the first gate metal layer 31. The perforated conductive wire 2a is connected to the perforated conductive wire 2b by a new wiring on the first gate metal layer. In a same manner as the abovementioned, a perforated conductive wire 2c and a perforated conductive wire 2d are arranged at the second opening B, the perforated conductive wire 2c is connected to the perforated conductive wire 2d by a new wiring on the first gate metal layer.

A perforated conductive wire 5a, a perforated conductive wire 7a, a perforated conductive wire 8a, a perforated conductive wire 5b, a perforated conductive wire 7b and a perforated conductive wire 8b are arranged between the second gate metal layer 32 and the first gate metal layer 31. The wiring 5 arranged on the first gate metal layer 31 is converted to the second gate metal layer 32 by the perforated conductive wire 5a and connected to a first new wiring arranged, that is, an arc-shaped wiring connected to the perforated conductive wire 5a as shown in the figure. Similarly, the wiring 7 arranged on the first gate metal layer 31 is converted to the second gate metal layer 32 by the perforated conductive wire 7a. The wiring 8 arranged on the first gate metal layer 31 is converted to the second gate metal layer 32 by the perforated conductive wire 8a.

After the wiring 5, the wiring 7 and the wiring 8 are converted to the second gate metal layer 32, the first new wiring corresponding to the perforated conductive wire arranged in the second gate metal layer passes through the first opening A of the wring 2, and continues to pass through the second opening B of the wiring 2 along a boundary of the second display area, so that the wiring 5, the wiring 7 and the wiring 8 bypass the second display area in the second gate metal layer.

After bypassing the second display area, the second gate metal layer 32 communicates with the first gate metal layer 31 by the perforated conductive wire 5b, the perforated conductive wire 7b and the perforated conductive wire 8b. The first new wiring (the wiring also corresponds to the perforated conductive wire 5a) corresponding to the perforated conductive wire 5b is converted to the first gate metal layer 31 by the perforated conductive wire 5b. A first new wiring corresponding to the perforated conductive wire 7b is converted to the first gate metal layer 31 by the perforated conductive wire 7b. A first new wiring corresponding to the perforated conductive wire 8b is converted to the first gate metal layer 31 by the perforated conductive wire 8b.

After the wiring 6 arranged on the second gate metal layer 32 successively passes through the first opening A and the second opening B along the boundary of the second display area, the wiring 6 continues to extend along the wiring direction of the wiring 6 in the first display area.

In the embodiments of the present disclosure, through the above embodiments, the wirings arranged on the first gate metal layer are adjusted to the second gate metal layer, to achieve bypassing the second display area, thereby increasing the light transmissive area of the second display area and effectively improving the light transmittance of the second display area.

Figure 6:
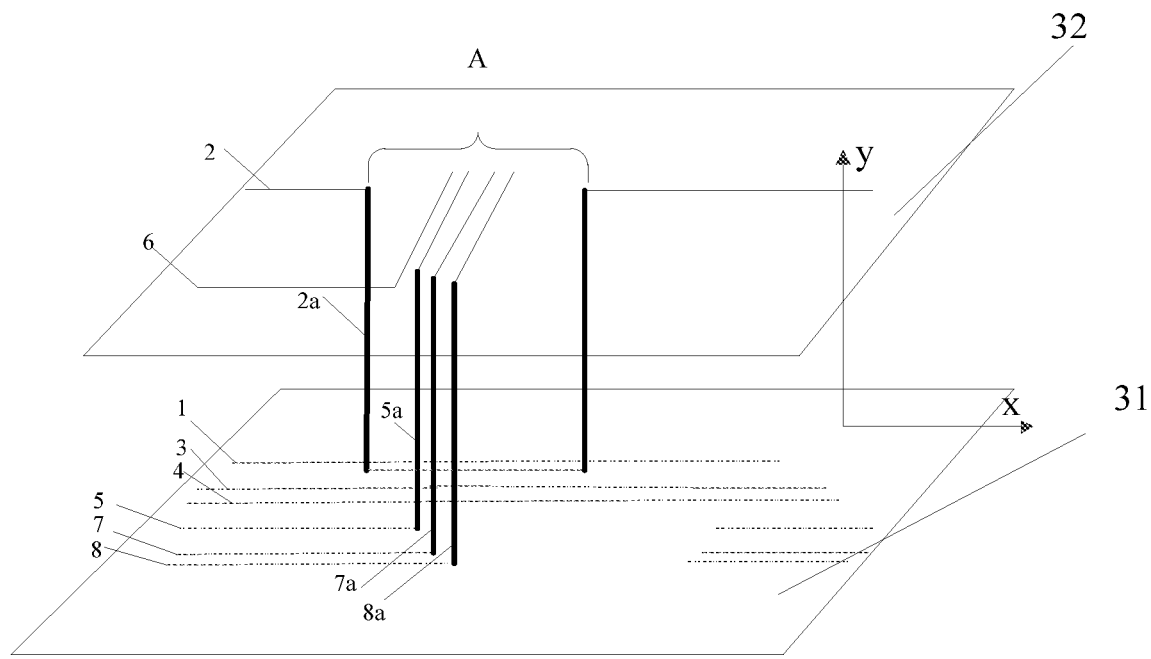
FIG. 6 is a wiring schematic diagram of a first opening A according to an embodiment of the present disclosure.

In order to understand the improvement on wiring arrangement provided by the embodiments of the present disclosure more clearly, the portion denoted by dotted circle corresponding to the first opening A at the left side of FIG. 5 is enlarged. FIG. 6 is schematic diagram of wiring at the first opening A according to an embodiment of the present disclosure.

As shown in FIG. 6, the wiring 6 in the second wiring group 123-2 is arranged on the second gate metal layer. After passing through the first opening A by changing the original wiring direction, the wiring 6 continues to extend along the shape of the second display area. The wiring 5, the wiring 7 and the wiring 8 in the second wiring group 123-2 are arranged in a plane where the first gate metal layer is located. The wiring 5, the wiring 7 and the wiring 8 arranged in the first gate metal layer 31 are adjusted to the second gate metal layer 32 by arranging the perforated conductive wire 5b, the perforated conductive wire 7b and the perforated conductive wire 8b between the first gate metal layer and the second gate metal layer, and then the second display area is bypassed through forming a first new wiring in the second gate metal layer 32, so as to increase the light transmissive area of the second display area and improve the light transmittance of the second display area.

Figure 7:
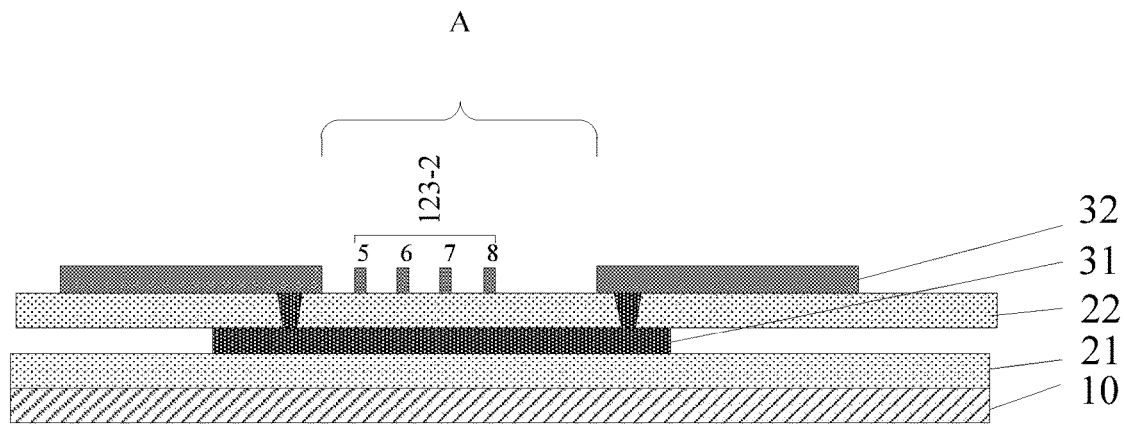
FIG. 7 is a schematic sectional view of a display panel at a first opening A according to an embodiment of the present disclosure.

A schematic sectional view of wiring provided by the embodiments of the present disclosure is described with reference to FIG. 7. The structural schematic diagram as shown in FIG. 7 is obtained along an A-A' hatching line as shown in FIG. 5. The A-A' hatching line is a schematic diagram obtained by cutting in a direction from the first opening A of the wiring 2 to a substrate base plate. FIG. 7 is a schematic sectional view of a display panel at the first opening A according to an embodiment of the present disclosure.

A first insulation layer 21 is arranged on the substrate base plate 10, a first gate metal layer 31 is arranged on the first insulation layer 21, a second insulation layer 22 is arranged on the first gate metal layer 31, and a second gate metal layer 32 is arranged on the second insulation layer 22. The second gate metal layer 32 as shown in FIG. 7 is the wiring 2. As shown in FIG. 7, the wiring 5, the wiring 6, the wiring 7 and the wiring 8 pass through the area of the first opening A.

Figure 8:
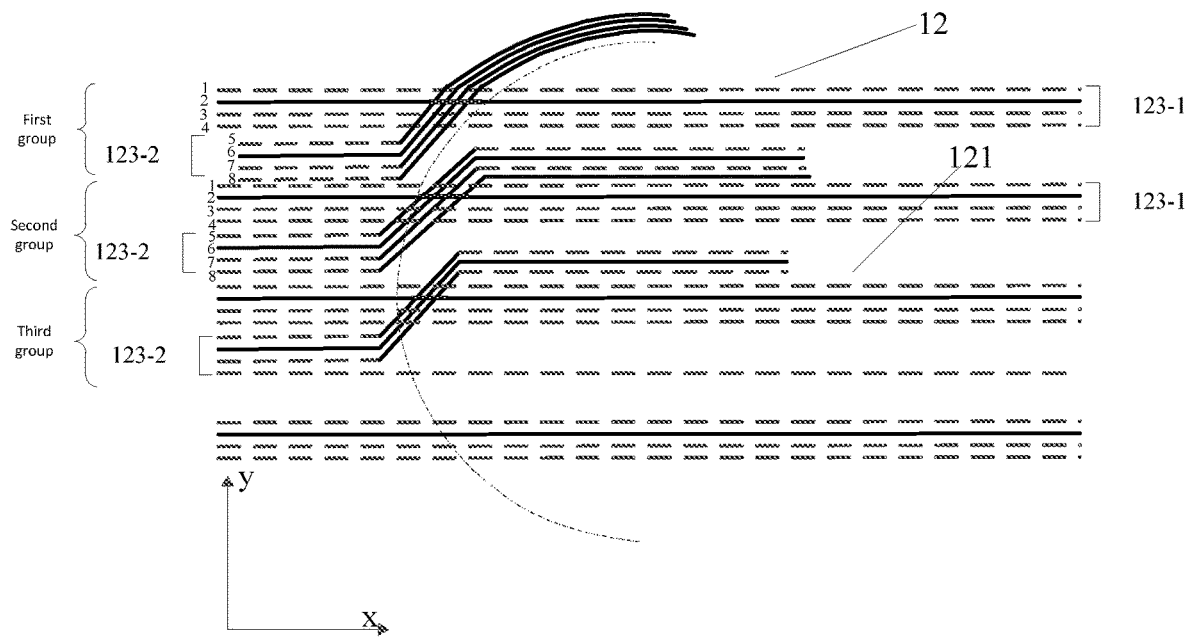
FIG. 8 is a schematic top view of a wiring scheme of a second wiring group according to another embodiment of the present disclosure.

In order to keep a uniformity of the display effect and prevent excessive second wiring groups from forming a frame around the second display area, referring to FIG. 8, FIG. 8 is a schematic top view of a wiring scheme of a second wiring group according to another embodiment of the present disclosure. As shown in FIG. 8, at least part of the first wiring group and part of the second wiring group are alternately arranged in the second display area according to a second order, and the alternate arrangement in the second order enables a blank area between the adjacent first wiring groups to be increased. The second order is different from the first order. If the first order means that an $i^{th}$ first wiring group is arranged at an upper area of an $i^{th}$ second wiring group, value of i is a positive integer that is less than or equal to M or N. The alternate arrangement in the first order means that the first wiring group and the second wiring group with a same serial number are alternately arranged from top to bottom in a plane of top view. The arrangement in the second order includes: after removing the second wiring group from an adjacent first wiring group as shown in FIG. 4, only the first wiring groups with different serial number in the second display area are successively arranged according to the order of the serial number. The alternate arrangement in the second order further includes that the second wiring group is arranged at an upper area of the first wiring group with a serial number difference of m, wherein m is an integer less than i.

When m is 0, that is, the $i^{th}$ second wiring group is arranged at an upper area of the $i^{th}$ first wiring group. When m is an integer greater than 0, that is, the $i^{th}$ second wiring group is arranged at an upper area of the $i^{th}$–$m^{th}$ first wiring groups, wherein m is an integer smaller than i.

In order to keep a uniformity of the display effect and prevent excessive second wiring groups from forming a frame around the second display area, in an exemplary embodiment, no second wiring group is arranged between parts of adjacent first wiring groups. Part of the $i^{th}$ second wiring group is arranged at an upper area of the $i^{th}$ or $i^{th}$–$m^{th}$ first wiring groups, wherein m is an integer smaller than i.

For eight wirings of the second group (that is, i=2) as shown in FIG. 8, the wirings 5-8 corresponding to the second wiring group 123-2 are arranged at an upper area of the wirings 1-4 of the first wiring group arranged in the second group through the wiring manner as shown in FIG. 5. FIG. 8 is a local schematic diagram of an opening at a single side. In the present disclosure, only the wirings 5-8 corresponding to the second wiring group 123-2 may be adjusted to the upper areas of the wirings 1-4, so as to increase the blank area between the adjacent first wiring groups, thereby increasing the light transmittance of the second display area.

Optionally, as shown in FIG. 8, the wiring distribution manner of the wirings 1-8 of the first group (i=1) from top to bottom may refer to the wiring distribution manner of FIG. 4. The wirings 5-8 in the wirings 1-8 of the second group (i=2) are adjusted to the upper areas of the wirings 1-4 in the second group, and treatment may be carried out with reference to the following manners:

as shown in FIG. 8, the wiring 5, the wiring 7 and the wiring 8 in the second group are adjusted to the upper area positions of the wiring arrangement area of the wirings 1-4 in the second group by arranging perforated conductive wires between the first gate metal layer and the second gate metal layer.

After the new wirings corresponding to the wiring 5, the wiring 7 and the wiring 8 passes through the arrangement area of the wirings 1-4, part of the new wirings may be adjusted back to the first gate metal layer by the perforated conductive wire, and part of the new wirings are along the second gate metal layer continuously. The spatial positions of the upper and lower layers of the first gate metal layer and the second gate metal layer may be overlapped, so the new wirings in FIG. 8 corresponding to the wiring 5, the wiring 7 and the wiring 8 in the second group are called a second new wiring group. The second new wiring group may include multiple second new wirings and multiple third new wirings.

Referring to the manner as shown in FIG. 5, the wiring 5, the wiring 7 and the wiring 8 in the second group are located in the first gate metal layer 31, and connected to the new wirings arranged in the second gate metal layer 32 through the perforated conductive wires 5a, 7a and 8a between the first gate metal layer 31 and the second gate metal layer 32. Herein, the new wirings corresponding to the wiring 5 and the wiring 7 are called as the second new wirings. After the second new wirings pass through the arrangement area of wirings 1-4 in the second group, the second new wirings are adjusted back to the first gate metal layer 31 by arranging the corresponding perforated conductive wires, and then the second new wirings are along the original wiring direction continuously. New wirings corresponding to the wiring 8 are called as the third new wirings, the third new wirings continue to extend to the second opening along the same wiring direction as that of the wiring 6, and then the third new wirings are adjusted back to the first gate metal layer through the perforated conductive wires corresponding to the third new wirings. The wiring 1, the wiring 3 and the wiring 4 in the second group are arranged in the first gate metal layer 31, and the wiring 2 is arranged in the second gate metal layer 32. The wiring 5, the wiring 7 and the wiring 8 in the second group are adjusted to the second gate metal layer 32 by the first opening and the second opening arranged on the wiring 2. The second new wirings corresponding to the wiring 5 and the wiring 7 intersects with orthographic projection areas of the wiring 1, the wiring 3 and the wiring 4 in the second group in the second gate metal layer 32. The third new wirings corresponding to the wiring 8 passes through the first opening and the second opening successively, after the third new wirings pass through the orthographic projection areas of the wiring 1, the wiring 3 and the wiring 4 in the second group in the second gate metal layer 32, the third new wirings are adjusted back to the first gate metal layer 31 through the perforated conductive wires.

As shown in FIG. 8, the wiring 6 and the wiring 8 in the second group may continue to extend along in the same extending direction of the wirings 1-4 in the second group on the second gate metal layer 32. After passing through the arrangement area of the wirings 1-4 in the second group, the wiring 5 and the wiring 7 in the second group return to the first gate metal layer through the arranged perforated conductive wires. In this way, when looking down in the top view, the arrangement positions of the wiring 5 and the wiring 7 are very similar to those of the wiring 6 and the wiring 8 on the second gate metal layer, and the arrangement positions may even be overlapped with each other, so that the area of the arrangement areas in the second display area is reduced, and the light transmittance of the second display area is increased.

Optionally, as shown in FIG. 8, FIG. 8 further shows that at least part of the first wiring group and part of the second wiring group are arranged according to the second order in the second display area:

in the second display area, no second wiring group is arranged between part of adjacent first wiring groups, for example, no second wiring group is arranged between the first group and the second group;

in the second display area, the second wiring group in the second group is arranged at an upper area of the first wiring group in the second group; and in the second display area, part of the second wiring of the second wiring group in the third group is arranged at an upper area of the first wiring group in the third group, and the other part of the second wiring group in the third group still continues to extend in the second display area according to the extending direction of the second wiring group in the first display area. According to the wiring design, it is comprehensively considered that there may be a part of wirings having no adjustable position space, and then the original wiring direction of the wirings is kept.

In an embodiment of the present disclosure, the original dense arrangement positions of the second wiring group and the first wiring group are adjusted such that there is a larger light transmitting area between the adjacent first wiring groups by the arrangement in the second order mentioned above, so that the light transmissive area of the second display area is increased, and then the light transmittance of the second display area is effectively increased.

As shown in FIG. 4, an opening A and an opening B that are axisymmetric are arranged on the wiring 2 in the first wiring group 123-1. Axis of symmetry is arranged in the second display area along the second direction, and the second direction is perpendicular to the first direction. FIG. 8 only shows multiple different wiring conditions at the opening A. The wiring condition of the opening B may refer to the wiring method as shown in FIG. 5, and the wiring corresponding to the multiple wiring conditions as shown in FIG. 8 is completed.

In an embodiment of the present disclosure, the wiring of the second wiring group in the second display area is adjusted, so that the area occupied by the second wiring group in the second display area is reduced, and then the light transmittance of the second display area is increased.

Figure 9:
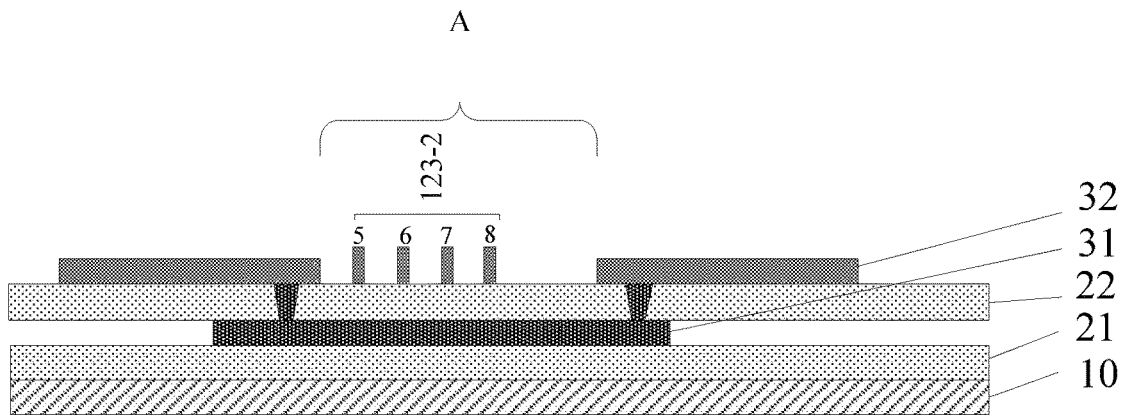
FIG. 9 is a schematic sectional view of a display panel at a first opening A according to another embodiment of the present disclosure.

Further, winding will lead to increase resistance during a winding process, therefore an embodiment of the present disclosure further provides an improved wiring structure to compensate for the resistance. Referring to FIG. 9, FIG. 9 is a schematic sectional view of a display panel at a first opening A according to another embodiment of the present disclosure. FIG. 9 is a schematic sectional view obtained by cutting the substrate base plate along A-A' hatching line as shown in FIG. 5. The second winding group 123-2 is wound along the edge of the second display area in the second gate metal layer, and successively passes through the first opening A and the second opening B, so that the length of wiring is increased and the resistance of wiring is increased. In the embodiment of the present disclosure, the wire cross sectional area of the above new wirings in the second gate metal layer may be increased, so that the wire cross sectional area is greater than that of the second wirings in the first gate metal layer. For example, in the embodiment of the present disclosure, the resistance may be compensated by increasing the thickness of each second wiring in the second wiring group.

Optionally, the resistance may be compensated by increasing the width of each second wiring.

Figure 10:
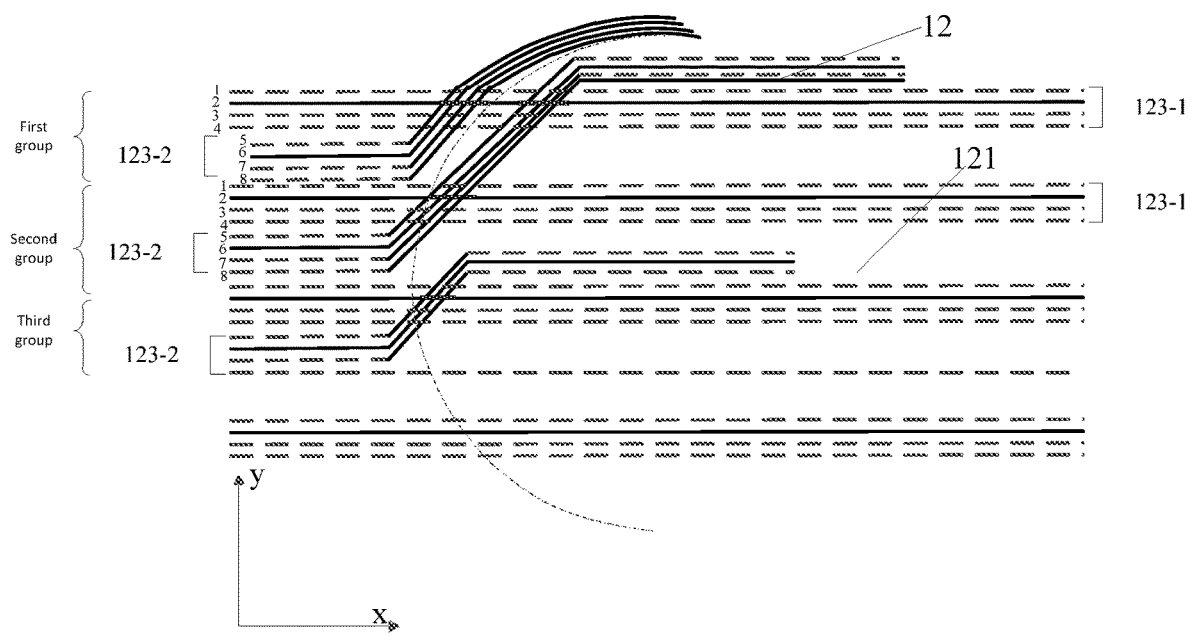
FIG. 10 is a schematic top view of a wiring scheme of a second wiring group according to another embodiment of the present disclosure.

Optionally, referring to FIG. 10, FIG. 10 is a schematic top view of a wiring scheme of a second wiring group according to another embodiment of the present disclosure. FIG. 10 shows a case when m is an integer greater than 0, that is, the $i^{th}$ second wiring group is arranged at an upper area of the $i^{th}-m^{th}$ first wiring group, and m is an integer less than i.

As shown in FIG. 10, multiple opening pairs may be arranged above No. 2 wiring of the first wiring group of the first group (i=1), the wirings of the second wiring group in the first group in the first gate metal layer are adjusted to outside the second display area by one group of the opening pairs, and the wirings of the second wiring group of the second group (i=2) in the first gate metal layer are adjusted to an upper area of the first wiring group in the first group by another group of opening pair. FIG. 10 shows a case of m=1, the problems of light transmittance and the frame may be comprehensively considered according to the actual needs, and then the value of m is selected. The part that is the same as the above embodiments may refer to the descriptions of FIG. 4-FIG. 7.

When two symmetrical opening pairs are arranged on the wiring 2 of the first wiring group 123-1 in the first group, the wiring design of the two opening positions at the left side is implemented according to a schematic diagram of local wiring of two openings at the left side shown in FIG. 10. The wiring design of two opening positions at the right side not shown in the figure may be implemented according to the wiring design corresponding to single opening at the right side shown in FIG. 5.

The second wiring group in the third group is arranged at an upper area of the first wiring group in the third group, so the light transmissive area between the first wiring group in the first group and the wiring group of the second group is obviously increased. Optionally, after part of the wirings bypass the display area, the winding is adjusted in the second display area in a manner that the second wiring group in the second group is arranged at an upper area of the first wiring group in the first group. In conclusion, in the embodiments of the present disclosure, the blank area between two adjacent first wiring groups is enlarged by adjusting the alternate arrangement relation between the first wiring group and the second wiring group, so that the light transmissive area of the second display area is increased, and the light transmittance of the second display area is improved.

In the embodiments of the present disclosure, the area occupied by the second wiring group in the second display area is effectively reduced by adjusting the arrangement positional relation of the second wiring group between the first gate metal layer and the second gate metal layer, so that the light transmittance of the second display area is improved, and the imaging quality of the second display area is improved when the second display area is reused for a camera function.

Under the same concept, an embodiment of the present disclosure further provides a display device, which includes the abovementioned display panel and a sensor unit, wherein the sensor unit is arranged in the second display area of the display panel and located at one side, of a substrate base plate away from a light exit direction, and a light-sensitive surface of the sensor unit is towards the display panel. The display panel provided by the embodiment of the present disclosure may be a flexible panel. When the display panel is a flexible panel, the substrate base plate includes a flexible substrate, and a flexible organic material, such as polyimide (PI) may be selected as the flexible organic material. The display panel provided by the embodiments of the present disclosure is applicable to a display device that needs to arrange a sensor under a screen. Herein, the sensor may be a camera, and the display device may be a tablet computer, a mobile phone, a touch computer, etc.

In the display panel and the display device provided by the embodiments of the present disclosure, the blank area between the adjacent first wiring groups is increased by adjusting the wiring order, so that the light transmissive area of the second display area is increased, and the light transmittance is improved.

The above description is only description about the embodiments of the present disclosure and adopted technical principles. Those skilled in the art should know that the scope of protection involved in the present disclosure is not limited to the technical solutions formed by specifically combining the abovementioned technical features and should also cover other technical solutions formed by freely combining the abovementioned technical features or equivalent features thereof without departing from the concept of the present disclosure, for example, technical solutions formed by mutually replacing the abovementioned features and (but not limited to) the technical features with similar functions disclosed in the present disclosure.

What is claimed is:

1. A display panel, comprising a first display area and a second display area, and M first wiring groups and N second wiring groups arranged along a first direction, wherein M and N are positive integers;
   in the first display area, the first wiring groups and the second wiring groups are arranged alternately according to a first order; and
   in the second display area, at least part of the first wiring groups and part of the second wiring groups are arranged according to a second order to increase a blank area between the adjacent first wiring groups, wherein the second order is different from the first order;
   wherein at least part of the first wiring groups and part of the second wiring groups being arranged according to the second order comprises:
   no second wiring group is arranged between at least part of the adjacent first wiring groups.

2. The display panel according to claim 1, wherein the first order means that an $i^{th}$ first wiring group is arranged at an upper area of an $i^{th}$ second wiring group, value of i is a positive integer that is less than or equal to M or N, and at least part of the first wiring groups and part of the second wiring groups being arranged according to the second order comprises:
   the $i^{th}$ second wiring group is arranged at the upper area of the $i^{th}$ first wiring group or the $i^{th}$ to $m^{th}$ first wiring groups, wherein m is an integer that is less than i.

3. The display panel according to claim 2, wherein the display panel comprises a first gate metal layer and a second gate metal layer, the first wiring group comprises a plurality of first wirings, and the second wiring group comprises a plurality of second wirings; wherein part of the first wirings are arranged in the first gate metal layer, and part of the first wirings are arranged in the second gate metal layer; part of the second wirings are arranged in the first gate metal layer, and part of the second wirings are arranged in the second gate metal layer; and the first wirings and the second wirings arranged in the first gate metal layer do not intersect with each other, and the first wirings and the second wirings arranged in the second gate metal layer do not intersect with each other;
   in the second display area, the first wiring group and the second wiring group being arranged according to the second order comprises:
   a first new wiring group is arranged in the second gate metal layer, and the second order is implemented by connecting the first new wiring group to the second wiring group; or
   a second new wiring group is arranged in the second gate metal layer, and the second order is implemented by connecting the second new wiring group to the second wiring group;
   wherein the first new wiring group comprises a plurality of first new wirings, wherein the first new wirings successively pass through a first opening and a second opening along an outer edge of the second display area, the first opening and the second opening are arranged on a first wiring in the first wiring group located in the second gate metal layer;
   wherein the second new wiring group comprises a plurality of second new wirings and a plurality of third new wirings, each second new wiring successively passes through the first opening and the second opening and intersects with an orthographic projection area of the first wiring group on the second gate metal layer between the first opening and the second opening, each third new wiring successively passes through the first opening and the second opening, and is close to a second wiring of the second wiring group on the second gate metal layer between the first opening and the side of the second opening, wherein the first opening and the second opening are arranged on a first wiring in the first wiring group located in the second gate metal layer.

4. The display panel according to claim 2, wherein in the first display area and the second display area with a same area, the number of pixel drive circuits in the second display area is less than the number of pixel drive circuits in the first display area.

5. The display panel according to claim 1, wherein the first order means that an $i^{th}$ first wiring group is arranged at an upper area of an $i^{th}$ second wiring group, value of i is a positive integer that is less than or equal to M or N, and at least part of the first wiring groups and part of the second wiring groups being arranged according to the second order comprise:
  no second wiring group is arranged between part of the adjacent first wiring groups; and
  part of the $i^{th}$ second wiring group is arranged at the upper area of the $i^{th}$ first wiring group or the $i^{th}$ to $m^{th}$ first wiring group, wherein m is an integer that is less than i.

6. The display panel according to claim 5, wherein the display panel comprises a first gate metal layer and a second gate metal layer, the first wiring group comprises a plurality of first wirings, and the second wiring group comprises a plurality of second wirings;
  wherein part of the first wirings are arranged in the first gate metal layer, and part of the first wirings are arranged in the second gate metal layer; part of the second wirings are arranged in the first gate metal layer, and part of the second wirings are arranged in the second gate metal layer;
  and the first wirings and the second wirings arranged in the first gate metal layer do not intersect with each other, and the first wirings and the second wirings arranged in the second gate metal layer do not intersect with each other;
  in the second display area, the first wiring group and the second wiring group being arranged according to the second order comprises:
  a first new wiring group is arranged in the second gate metal layer, and the second order is implemented by connecting the first new wiring group to the second wiring group; or
  a second new wiring group is arranged in the second gate metal layer, and the second order is implemented by connecting the second new wiring group to the second wiring group;
  wherein the first new wiring group comprises a plurality of first new wirings, wherein the first new wirings successively pass through a first opening and a second opening along an outer edge of the second display area, the first opening and the second opening are arranged on a first wiring in the first wiring group located in the second gate metal layer;
  wherein the second new wiring group comprises a plurality of second new wirings and a plurality of third new wirings, each second new wiring successively passes through the first opening and the second opening and intersects with an orthographic projection area of the first wiring group on the second gate metal layer between the first opening and the second opening, each third new wiring successively passes through the first opening and the second opening, and closes is close to a second wiring of the second wiring group on the second gate metal layer between the first opening and the side of the second opening, wherein the first opening and the second opening are arranged on a first wiring in the first wiring group located in the second gate metal layer.

7. The display panel according to claim 5, wherein in the first display area and the second display area with a same area, the number of pixel drive circuits in the second display area is less than the number of pixel drive circuits in the first display area.

8. The display panel according to claim 1, wherein the first order means that an $i^{th}$ first wiring group is arranged at an upper area of an $i^{th}$ second wiring group, value of i is a positive integer that is less than or equal to M or N, and at least part of the first wiring groups and part of the second wiring groups being arranged according to the second order comprises:
  no second wiring group is arranged between part of the adjacent first wiring groups;
  part of the $i^{th}$ second wiring group is arranged at an upper area of the $i^{th}$ first wiring group or the $i^{th}$ to $m^{th}$ first wiring group, wherein m is an integer that is less than i;
  part of second wirings in part of the $i^{th}$ second wiring group is arranged at the upper area of the $i^{th}$ first wiring group or the $i^{th}$ to $m^{th}$ first wiring group; and
  another part of second wirings in part of the $i^{th}$ second wiring group continues to extend in the second display area according to an extending direction of the second wirings in the first display area.

9. The display panel according to claim 8, wherein the display panel comprises a first gate metal layer and a second gate metal layer, the first wiring group comprises a plurality of first wirings, and the second wiring group comprises a plurality of second wirings;
  wherein part of the first wirings are arranged in the first gate metal layer, and part of the first wirings are arranged in the second gate metal layer; part of the second wirings are arranged in the first gate metal layer, and part of the second wirings are arranged in the second gate metal layer;
  and the first wirings and the second wirings arranged in the first gate metal layer do not intersect with each other, and the first wirings and the second wirings arranged in the second gate metal layer do not intersect with each other;
  in the second display area, the first wiring group and the second wiring group being arranged according to the second order comprises:
  a first new wiring group is arranged in the second gate metal layer, and the second order is implemented by connecting the first new wiring group to the second wiring group; or
  a second new wiring group is arranged in the second gate metal layer, and the second order is implemented by connecting the second new wiring group to the second wiring group;
  wherein the first new wiring group comprises a plurality of first new wirings, wherein the first new wirings successively pass through a first opening and a second opening along an outer edge of the second display area, the first opening and the second opening are arranged on a first wiring in the first wiring group located in the second gate metal layer;
  wherein the second new wiring group comprises a plurality of second new wirings and a plurality of third new wirings, each second new wiring successively passes through the first opening and the second opening and intersects with an orthographic projection area of the first wiring group on the second gate metal layer between the first opening and the second opening, each third new wiring successively passes through the first opening and the second opening, and is close to a second wiring of the second wiring group on the second gate metal layer between the first opening and the side of the second opening, wherein the first opening and the second opening are arranged on a first wiring in the first wiring group located in the second gate metal layer.

10. The display panel according to claim 8, wherein in the first display area and the second display area with a same area, the number of pixel drive circuits in the second display area is less than the number of pixel drive circuits in the first display area.

11. The display panel according to claim 1, wherein the display panel comprises a first gate metal layer and a second gate metal layer, the first wiring group comprises a plurality of first wirings, and the second wiring group comprises a plurality of second wirings;

wherein part of the first wirings are arranged in the first gate metal layer, and part of the first wirings are arranged in the second gate metal layer; part of the second wirings are arranged in the first gate metal layer, and part of the second wirings are arranged in the second gate metal layer;

and the first wirings and the second wirings arranged in the first gate metal layer do not intersect with each other, and the first wirings and the second wirings arranged in the second gate metal layer do not intersect with each other;

in the second display area, the first wiring group and the second wiring group being arranged according to the second order comprises:

a first new wiring group is arranged in the second gate metal layer, and the second order is implemented by connecting the first new wiring group to the second wiring group; or a second new wiring group is arranged in the second gate metal layer, and the second order is implemented by connecting the second new wiring group to the second wiring group;

wherein the first new wiring group comprises a plurality of first new wirings, wherein the first new wirings successively pass through a first opening and a second opening along an outer edge of the second display area, the first opening and the second opening are arranged on a first wiring in the first wiring group located in the second gate metal layer;

wherein the second new wiring group comprises a plurality of second new wirings and a plurality of third new wirings, each second new wiring successively passes through the first opening and the second opening and intersects with an orthographic projection area of the first wiring group on the second gate metal layer between the first opening and the second opening, each third new wiring successively passes through the first opening and the second opening, and is close to a second wiring of the second wiring group on the second gate metal layer between the first opening and the second opening, wherein the first opening and the second opening are arranged on a first wiring in the first wiring group located in the second gate metal layer.

12. The display panel according to claim 11, wherein the first new wiring group being arranged in the second gate metal layer and the second order being implemented by connecting the first new wiring group to the second wiring group comprises:

the first new wiring group is arranged in the second gate metal layer;

a plurality of first perforated conductive wires are arranged between the first gate metal layer and the second gate metal layer, one end of each first perforated conductive wire is connected to a second wiring which is corresponding to the first perforated conductive wire and arranged in the first gate metal layer, and the other end of each first perforated conductive wire is connected to a first new wiring which is corresponding to the first perforated conductive wire and arranged in the second gate metal layer;

in the second wiring group, a second wiring located in the first gate metal layer is connected to a first new wiring corresponding to the second wiring through a first perforated conductive wire corresponding to the second wiring; and in the second wiring group, a second wiring located in the second gate metal layer successively passes through the first opening and the second opening along the outer edge of the second display area.

13. The display panel according to claim 11, wherein the second new wiring group being arranged in the second gate metal layer and the second order being implemented by connecting the second new wiring group to the second wiring group comprises:

the second new wiring group is arranged in the second gate metal layer;

a plurality of second perforated conductive wires are arranged between the first gate metal layer and the second gate metal layer, one end of each second perforated conductive wire is connected to a second wiring which is corresponding to the second perforated conductive wire and arranged in the first gate metal layer, and the other end of each second perforated conductive wire is connected to a second new wiring or a third new wiring which is corresponding to the second perforated conductive wire and arranged in the second gate metal layer;

in the second wiring group, a second wiring located in the first gate metal layer is connected to the second new wiring or the third new wiring corresponding to the second wiring at the side of the first opening and the side of the second opening through a second perforated conductive wire connected to the second wiring; and in the second wiring group, the second wirings located in the second gate metal layer are arranged successively along a same wiring direction as the second new wirings and the third new wirings.

14. The display panel according to claim 13,
wherein the wire cross sectional area of the second new wiring and the third new wiring in the second gate metal layer is greater than that of the second wirings in the first gate metal layer.

15. The display panel according to claim 11,
wherein a wire cross sectional area of a first new wiring in the second gate metal layer is greater than a wire cross sectional area of the second wiring in the first gate metal layer.

16. The display panel according to claim 1, wherein in the first display area and the second display area with a same area, the number of pixel drive circuits in the second display area is less than the number of pixel drive circuits in the first display area.

17. A display device, comprising the display panel according to claim 1, further comprising a sensor unit, wherein the sensor unit is arranged in the second display area of the display panel and located at one side of a substrate base plate away from a light exit direction, and a light-sensitive surface of the sensor unit is towards the display panel.

* * * * *